US009865346B1

(12) United States Patent
Perroni et al.

(10) Patent No.: US 9,865,346 B1
(45) Date of Patent: Jan. 9, 2018

(54) PHASE CHANGE MEMORY DEVICE AND METHOD OF OPERATION

(71) Applicant: STMicroelectronics S.r.l., Agrate Brianza (IT)

(72) Inventors: Maurizio Francesco Perroni, Furnari (IT); Carmelo Paolino, Palermo (IT); Salvatore Polizzi, Palermo (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 15/475,609

(22) Filed: Mar. 31, 2017

(30) Foreign Application Priority Data

Aug. 11, 2016 (IT) .......................... 102016000084790

(51) Int. Cl.
*G11C 11/00* (2006.01)
*G11C 13/00* (2006.01)

(52) U.S. Cl.
CPC ........ *G11C 13/004* (2013.01); *G11C 13/0004* (2013.01); *G11C 13/0026* (2013.01); *G11C 13/0064* (2013.01); *G11C 13/0069* (2013.01)

(58) Field of Classification Search
CPC .............. G11C 13/004; G11C 13/0069; G11C 13/0026; G11C 13/0004; G11C 13/0064
USPC ........................... 365/163, 158, 207, 189.07
See application file for complete search history.

(56) References Cited

U.S. PATENT DOCUMENTS

| 7,940,553 | B2 | 5/2011 | Wu et al. |
| 8,750,047 | B2 | 6/2014 | Perroni et al. |
| 8,982,615 | B2 | 3/2015 | Conte et al. |
| 2002/0085423 | A1 | 7/2002 | Tedrow et al. |
| 2003/0043623 | A1 | 3/2003 | Shimbayashi et al. |
| 2007/0133268 | A1 | 6/2007 | Choi et al. |
| 2009/0273961 | A1 | 11/2009 | Ono et al. |
| 2013/0301348 | A1 | 11/2013 | Perroni et al. |
| 2015/0243356 | A1 | 8/2015 | Conte et al. |
| 2016/0211036 | A1* | 7/2016 | Takizawa .............. G11C 11/161 |

* cited by examiner

*Primary Examiner* — David Lam
(74) *Attorney, Agent, or Firm* — Slater Matsil, LLP

(57) ABSTRACT

A phase change memory device includes two portions with local bitlines connected to memory cells. A reading stage is configured to read logic data stored by the first and second memory cells. A first main bitline extends between the reading stage and the first local bitlines and a first main switch is coupled between the first main bitline and reading stage and likewise for the second portion. Local switches are associated with respective ones of the local bitlines. A first reference signal generator is coupled to the reading stage. The phase change memory device is configured to operate in a first reading mode, in which the logic data stored by the first memory cell is read by the reading stage by comparison with the reference signal.

23 Claims, 3 Drawing Sheets

PHASE CHANGE MEMORY DEVICE AND METHOD OF OPERATION

CROSS-REFERENCE TO RELATED APPLICATIONS

This application claims priority to Italian Patent Application No. 102016000084790, filed on Aug. 11, 2016, which application is hereby incorporated herein by reference.

TECHNICAL FIELD

The present invention relates to a phase change memory device, to a system including the phase change memory device and to an operating method of the phase change memory device.

BACKGROUND

Non-volatile phase change memories (PCMs) are known, which exploit, for storing information, the characteristics of materials that have the property of switching between phases that present different electrical characteristics. For instance, the materials may switch between an amorphous phase, which is disorderly and a crystalline or polycrystalline phase, which is orderly and the two phases are associated to resistivities of a considerably different value and consequently to a different value of a datum stored. For instance, the elements of Group VI of the periodic table, such as tellurium (Te), selenium (Se), or antimony (Sb), called chalcogenides or chalcogenic materials, may advantageously be used for producing phase change memory cells.

Phase changes are obtained by locally increasing the temperature of the cells of chalcogenic material, through resistive electrodes (generally known as heaters) arranged in contact with respective regions of chalcogenic material. Selection devices (for example, MOSFETs), are connected to the heaters and enable passage of an electric programming current through a respective heater. The electric current, by the Joule effect, generates the temperatures necessary for phase change. During reading, the state of the chalcogenic material is detected by applying a voltage sufficiently low as not to cause a sensible heating and then by reading the value of the current that flows in the cell. Given that the current is proportional to the conductivity of the chalcogenic material, it is possible to determine what state the material is in and thus trace back to the datum stored in the memory cell.

In a known way, non-volatile memories comprise an array of memory cells arranged in rows (wordlines) and columns (bitlines). Each memory cell is formed, in the case of PCMs, by a phase change memory element of and by a selection transistor, connected in series. A column decoder and a row decoder enable selection, on the basis of logic address signals received at input and more or less complex decoding schemes, of the memory cells and in particular the corresponding wordlines and bitlines, each time addressed.

The column decoder comprises a plurality of analog selection switches (formed by transistors), which receive the address signals on the respective control terminals. The selection switches are arranged according to a tree structure in hierarchical levels and their number in each hierarchical level is linked to the organization and to the size of the memory array. Once enabled, the selection switches enable the bitline selected to be brought to a defined value of voltage and/or current, according to the operations that are to be implemented. In particular, a current path is created between a programming stage or a reading stage and the bitline selected. The current path is defined by the series of a certain number of selection switches.

In a known way, sense amplifiers carry out reading of the data stored in the memory cells by comparing the current that flows in the memory cell selected (or an electrical quantity correlated thereto) with a reference current that flows in a reference cell (the so-called "double-ended reading"), or else with a reference current supplied by a reference-current generator (the so-called "single-ended reading"). Single-ended reading is typically used when verifying that programming of the cell has gone through or during testing, whereas double-ended reading is typically used during normal use of the memory, for reading the logic datum stored in the cell that is to be read.

To carry out single-ended reading, an input of the sense amplifier receives the current of the memory cell that is to be read, whereas the other input of the sense amplifier receives the reference current supplied by the reference-current generator.

In both of the modes referred to, it is expedient to guarantee, as far as possible, similar working conditions for the sense amplifier, paying particular attention to the capacitive load on the two inputs thereof. This need, however, is hard to be found in single-ended reading systems in so far as, in a per se known manner, the capacitance associated to a reference-current generator used in single-ended reading is different from the capacitance that derives from the bitlines used to carry the current signal of the cell that is to be read.

Furthermore, it may be noted that the effective value of capacitance associated to the bitlines is affected by a series of unforeseeable factors, such as the manufacturing process spread. Consequently, fluctuations may occur that do not render convenient the use of a pre-set capacitance associated to the reference-current generator.

SUMMARY

Embodiments of the present invention provide a PCM device that will enable the problems associated to the decoders of a known type to be solved totally or in part and that will be optimized as regards the characteristics of capacitive load seen by the sense amplifier in both the single-ended reading mode and in the double-ended reading mode. Embodiments of the present invention also teach an operating method of the PCM memory device.

According to the present invention, a phase change memory device, a system including the phase change memory device and an operating method of the phase change memory device are consequently provided.

BRIEF DESCRIPTION OF THE DRAWINGS

For a better understanding of the present invention, preferred embodiments thereof are now described, purely by way of non-limiting example and with reference to the attached drawings, wherein.

DETAILED DESCRIPTION OF ILLUSTRATIVE EMBODIMENTS

As will be described in detail in what follows, an aspect of the present disclosure envisages splitting the column decoder into two portions that may be controlled independently of one another and configuring the driving signals of the two portions of the column decoder to guarantee a comparable capacitive load on the two inputs of the sense amplifier in both the single-ended reading operation (reading of a logic datum stored in a memory cell by comparison with a current reference) and the double-ended reading operation (reading of a logic datum stored in a memory cell through comparison with a further memory cell). Single-ended reading is typically used during verification of data previously written in the memory.

In particular, in the case of single-ended reading of a memory cell selected via the corresponding wordline and coupled to a local bitline of a memory sector, the sense amplifier will have, on a first input thereof, the capacitance associated to the local bitline plus the capacitance associated to a first main bitline to which the local bitline is connected. Furthermore, the sense amplifier will receive, on a second input thereof, the reference current used for the comparison but also a capacitance associated to a further main bitline that, during this operation, is decoupled from local bitlines. In other words, the sense amplifier receives on both of the inputs a capacitive load of a similar amount.

Since, the value of capacitance of the main bitlines of a PCM is up to 10 times that of the local bitlines, the capacitive contribution of the latter may be neglected (e.g., 40 fF for the local bitline and 400 fF for the main bitline).

Figure 1:
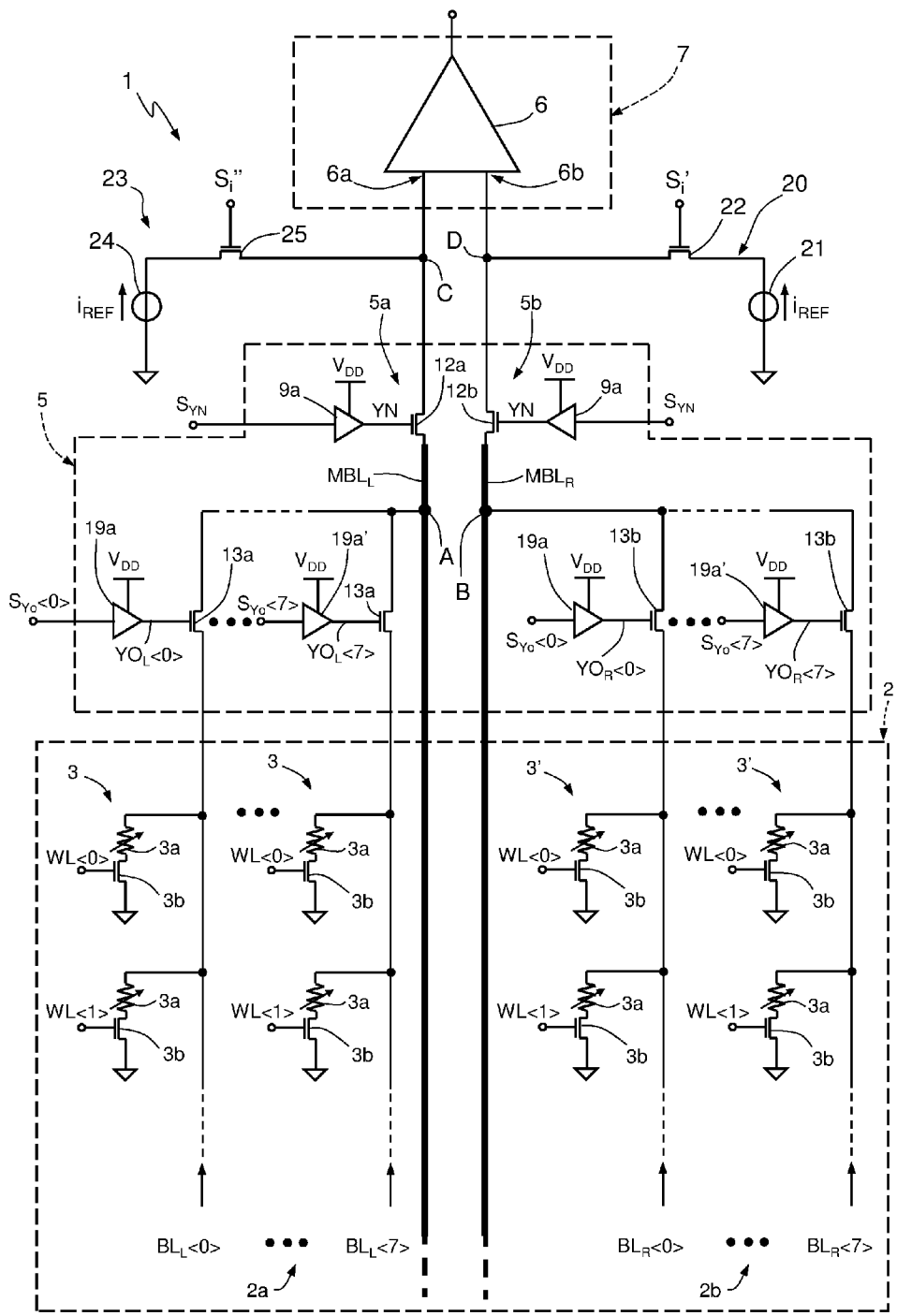
FIG. 1 shows a schematic circuit diagram of a portion of a non-volatile memory device, in particular of a PCM type and of a corresponding column decoder, according to one embodiment of the present invention.

Illustrated schematically in FIG. 1 and designated as a whole by the reference number 1 is a portion of a non-volatile memory device, in particular of a PCM type, limitedly to just the parts necessary for an understanding of the present disclosure.

In particular, the non-volatile memory device 1 comprises a memory array 2, constituted by a plurality of first memory cells 3 and by a plurality of second memory cells 3', which may be selected by local wordlines WL and local bitlines BL. In a per se known manner, the second memory cells 3' correspond, as regards number and characteristics of production, to the first memory cells 3 and, in use, store the same logic datum as the first memory cells 3 (they represent, in fact, a physical and logical copy of the first memory cells 3). The second memory cells 3' are queried during double-ended reading of the first memory cells 3, for reading the logic datum stored in the first memory cells 3 through comparison with the logic datum stored in respective second memory cells 3'.

Illustrated in FIG. 1 are first memory cells 3, operatively coupled to respective local wordlines WL, designated by WL<0> and WL<1> and to respective local bitlines $BL_L$, here eight in number and designated by $BL_L<0>, \ldots, BL_L<7>$. Likewise shown are second memory cells 3', operatively coupled to the local wordlines WL<0> and WL<1> and to respective local bitlines $BL_R$, here eight in number and designated by $BL_R<0>, \ldots, BL_R<7>$.

The local bitlines $BL_L<0>, \ldots, BL_L<7>$ and the first memory cells 3 form a first memory portion 2a. The local bitlines $BL_R<0>, \ldots, BL_R<7>$ and the second memory cells 3' form a second memory portion 2b.

The first and second memory cells 3, 3' are identical to one another and comprise a phase change element 3a and a selector element 3b, operatively coupled thereto. The phase change element 3a includes a phase change material (for example, a chalcogenide) and is thus able to store data in the form of levels of resistance associated to the different phases assumed by the phase change material (in FIG. 1, the phase change element 3a is represented as a resistor with variable resistance). The selector element 3b, in the embodiment illustrated, is an NMOS transistor having its gate terminal connected to the respective wordline WL, a first conduction terminal connected to the phase change element 3a and a second conduction terminal connected to a reference potential (for example, ground). The selector element 3b is controlled for enabling, when selected (i.e., turned on by the signal of the respective local wordline WL to which it is coupled), passage of a reading current through the phase change element 3a during an operation of reading of the logic datum stored therein.

The non-volatile memory device 1 further comprises a row decoder (not illustrated herein), designed to select the local wordline WL corresponding to the memory cell 3, 3' each time to be addressed and a column decoder 5, designed to select the bitline of the memory cell 3, 3' to be addressed. Given the matrix structure, activation of a local wordline WL and of a local bitline BL enables unique selection of one and only one memory cell 3, 3'. The column decoder 5 is arranged between the memory array 2 and a reading stage 7, of a per se known type and provided with a sense amplifier 6. A programming stage for the first and second memory cells 3, 3', which is also per se known and provided with programming driver, is present but not illustrated in so far as it does not form the subject of the present disclosure.

In particular, during use, the column decoder 5 receives at input address selection signals (also known as "decoded address signals", or DAS) $S_{YO}<0>, \ldots, S_{YO}<7>$ for selecting a respective local bitline $BL_L<0>, \ldots, BL_L<7>$ and/or $BL_R<0>, \ldots, BL_R<7>$ in order to access the first and/or second memory cells 3, 3'. The modality of selection of the local bitlines $BL_L<7:0>$ and $BL_R<7:0>$ is more fully illustrated in what follows with reference to FIG. 2. The signals $S_{YO}<7:0>$ are low-voltage signals, which operate that is, in the range of logic voltages [GND,VDD], where VDD is, for example, comprised between 1 V and 1.4 V and GND is a reference ground voltage, for example, 0 V.

In greater detail, the column decoder 5 is configured to generate a current path between a bitline selected from $BL_L<0>, \ldots, BL_L<7>$ and a first input 6a of the sense amplifier 6 and between a bitline selected from $BL_R<0>, \ldots, BL_R<7>$ and a second input 6b of the sense amplifier 6.

A first main bitline $MBL_L$ extends between the first input 6a of the sense amplifier 6 and a node A common to all the local bitlines $BL_L<0>, \ldots, BL_L<7>$, through interposition of a main selection switch 12a. A second main bitline $MBL_R$ extends between the second input 6b of the sense amplifier 6 and a node B common to all the local bitlines $BL_R<0>, \ldots, BL_R<7>$, through interposition of a respective main selection switch 12b.

Each local bitline $BL_L<0>, \ldots, BL_L<7>$ of the first memory portion 2a is electrically coupled to the node A by a respective local selection switch 13a (in the example of FIG. 1 local selection switches 13a are present in the form of NMOS transistors). Likewise, each local bitline $BL_R<0>, \ldots, BL_R<7>$ of the second memory portion 2b is electrically coupled to the node B by a respective local selection switch 13b (in this example, NMOS transistors).

According to one aspect of the present disclosure, the column decoder 5 thus comprises two distinct read-decoding circuits and in particular a first read-decoding block 5a and a second read-decoding block 5b, designed to generate a respective current path between a first memory cell 3 selected and the first input 6a of the sense amplifier and, respectively, between a second memory cell 3' selected and the second input 6b of the sense amplifier 6. The current paths thus generated are completely distinct and separate from one another.

The first read-decoding block 5a and the second read-decoding block 5b have a specular circuit structure. The number of selection switches that form the column decoder 5 depends upon the size of the memory array 2 and/or of the sectors of the memory array 2 and upon the hierarchical organization of the column selectors.

The first and second read-decoding blocks 5a, 5b further comprise main buffers 9a that drive the main selection switches 12a, 12b. For simplicity of representation, FIG. 1 illustrates two main buffers 9a coupled to the respective selection switches 12a, 12b. However, since driving of the selection switches 12a, 12b is common to both, it is possible to use a common main buffer 9a the output of which is connected to the selection switches 12a, 12b. It is consequently assumed, in the sequel of the description, that a single main buffer 9a is present that drives both of the selection switches 12a, 12b. The main buffer 9a receives the signal $S_{YN}$ and supplies to the control terminals of the respective selection switches 12a, 12b a column-decoding signal YN.

The first and second read-decoding blocks 5a, 5b further comprise a respective plurality of local buffers 19a, 19a'. Bitlines belonging to the first portion 2a and corresponding to respective bitlines of the second portion 2b of the memory array 2 (i.e., the bitlines selected by a same signal $S_{YO}<7:0>$) may share a same local buffer 19a, 19a'. In this case, the local buffers are in number equal to one half of the sum of the local selection switches 13a and 13b and are configured to receive a respective signal from among $S_{YO}<0>, \ldots, S_{YO}<7>$ and supply to the control terminals of the respective local selection switches 13a, 13b column-decoding signals $YO_L<0>, \ldots, YO_L<7>, YO_R<0>, \ldots, YO_R<7>$. In greater detail, the local buffer 19a that receives at input the signal $S_{YO}<0>$ generates at output both of the signals $YO_L<0>$ and $YO_R<0>$ that drive two respective switches 13a, 13b associated to the bitlines $BL_L<0>$ and $BL_R<0>$ belonging to the respective portions 2a, 2b of the memory array 2; likewise, the local buffer that receives at input the signal $S_{YO}<1>$ generates at output the signals $YO_L<1>$ and $YO_R<1>$ that drive the two respective switches 13a, 13b associated to the bitlines $BL_L<1>$ and $BL_R<1>$; and so forth until finally the local buffer 19a' that receives at input the signal $S_{YO}<7>$ generates at output the signals $YO_L<7>$ and $YO_R<7>$ that drive the two respective switches 13a, 13b associated to the bitlines $BL_L<7>$ and $BL_R<7>$.

According to an aspect of the present disclosure, the column-decoding signals $YO_L<0>, \ldots, YO_L<7>$ may have a value different from that of the column-decoding signals $YO_R<0>, \ldots, YO_R<7>$, as a result of operations carried out by the local buffers 19a, 19a', as illustrated more fully hereinafter. In this way, starting from a same signal $S_{YO}<7:0>$ received at input by the column decoder 5, it is possible to generate two command signals $YO_L<7:0>$ and $YO_R<7:0>$ independent of one another, for governing in an independent way respective selection switches 13a, 13b and thus rendering the first and second memory portions 2a, 2b controllable in a separate way independently of one another.

Even though in FIG. 1 a first read-decoding block 5a and a second read-decoding block 5b including just two main selection switches 12a, 12b are illustrated, it is evident that, in a known way, there may be present a plurality of main switches 12a, 12b connected between a node C and respective further main bitlines belonging to the first memory portion 2a and between a node D and respective further main bitlines belonging to the second memory portion 2b (each further main bitline being, in turn, coupled to a respective plurality of local bitlines) as illustrated with reference to FIG. 1.

The selection switches 12a, 12b, 13a, 13b are implemented by NMOS transistors, which have a control terminal (gate) that receives the respective column-decoding signal YN, $YO_L<7:0>$, $YO_R<7:0>$, which is a logic signal having a voltage value in the range from 0 V to 3.6 V (where the value 0 V corresponds to the low logic signal "0" that turns off the respective transistor and the value 3.6 V corresponds to the high logic signal "1" that turns on the respective transistor). In use, the signals $S_{YO}<0>, \ldots, S_{YO}<7>$ and $S_{YN}$ are, as has been indicated, low-voltage signals and one of the operations carried out by the main buffers 9a and local buffers 19a, 19a' is that of raising the voltage to generate a voltage signal adequate for driving the respective NMOS transistor.

The non-volatile memory device 1 further comprises a first reference branch 20 including a reference generator 21, configured to generate a reference current $i_{REF}$, electrically coupled to the second input 6b of the sense amplifier 6 by a selection switch 22. The selection switch 22 is driven by a signal $S_i'$, configured to turn on and turn off the selection switch 22 in respective operating modes of the non-volatile memory device 1, in order to set up or interrupt an electrical path for the reference current $i_{REF}$ towards the second input 6b of the sense amplifier 6.

The non-volatile memory device 1 further comprises a second reference branch 23 including a reference generator 24, configured to generate a reference current $i_{REF}$, electrically coupled to the first input 6a of the sense amplifier 6 by a selection switch 25. The selection switch 25 is driven by a signal $S_i''$, configured to turn on and turn off the selection switch 25 in respective operating modes of the non-volatile memory device 1 in order to set up or interrupt an electrical path for the reference current $i_{REF}$ towards the first input 6a of the sense amplifier 6.

Figure 2:
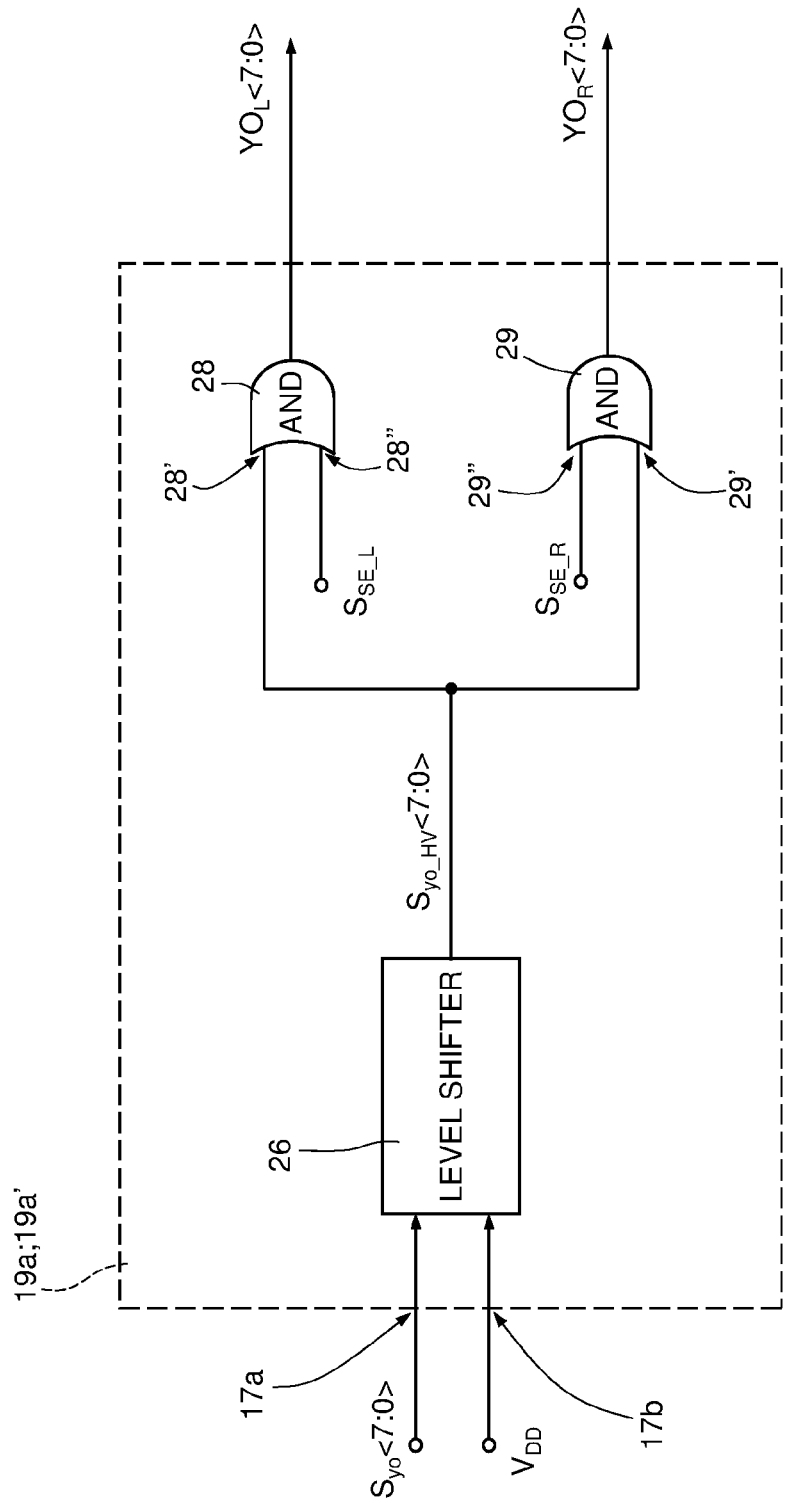
FIG. 2 shows in greater detail a driving buffer that forms part of the column decoder of FIG. 1.

FIG. 2 shows an embodiment of the local buffer 19a or the local buffer 19a' (which are identical as regards their physical implementation). Each local buffer 19a, 19a' has two inputs 17a, 17b, which receive, respectively, one of the signals $S_{YO}<0>, \ldots, S_{YO}<7>$ and the voltage VDD comprised between 1 V and 1.4 V. These two inputs are, in particular, the inputs of a level shifter 26, configured to generate at output an intermediate signal $S_{YO\_HV}<0>, \ldots, S_{YO\_HV}<7>$ by raising the voltage value of the signal $S_{YO}<0>, \ldots, S_{YO}<7>$. The intermediate signal $S_{YO\_HV}<0>, \ldots, S_{YO\_HV}<7>$ has a value comprised between 0 V and 3.6 V.

The local buffer 19a, 19a' has further a first logic gate 28 and a second logic gate 29, each configured to carry out an AND logic operation. The first logic gate 28 receives on a first input 28' the intermediate signal $S_{YO\_HV}<0>, \ldots, S_{YO\_HV}<7>$ and on a second input 28" a signal $S_{SE\_L}$. The signal $S_{SE\_L}$ is a logic signal the value of which, high "1" (e.g., 3.6 V) or low "0" (e.g., 0 V), indicates an operating condition of the non-volatile memory device 1 between single-ended reading and double-ended reading.

The second logic gate 29 receives on a first input 29' the intermediate signal $S_{YO\_HV}<0>, \ldots, S_{YO\_HV}<7>$ and on a second input 29" a signal $S_{SE\_R}$. The signal $S_{SE\_R}$ is a logic signal the value of which, high "1" or low "0", indicates an operating condition of the non-volatile memory device 1 between single-ended reading and double-ended reading.

For instance, for double-ended reading operations of the memory cell 3 addressed by the bitline $BL_L<0>$, the signal $S_{YO}<0>$ assumes a value of 1V. The remaining signals $S_{YO}<7:1>$ assume a value of 0 V.

The level shifter 26 raises the value of the signal $S_{YO}<0>$ from the value 1V to the value 3.6 V, thus generating the signal $S_{YO\_HV}<0>$ (high logic value "1").

Since, in the double-ended reading mode, it is desired to carry out a comparative reading of two corresponding memory cells 3, 3', both of the signals $S_{SE\_L}$ and $S_{SE\_R}$ are generated with a high logic value "1", so that both of the signals $YO_L<0>$ and $YO_R<0>$ at output from the logic gates 28, 29 have a high logic value "1", in particular 3.6 V. As described with reference to FIG. 1, such a signal $YO_L<0>$ turns on the respective transistor 13a, electrically coupling the memory cell 3 selected to the node A. Likewise, the signal $YO_R<0>$ turns on the respective transistor 13b, electrically coupling the memory cell 3' selected to the node B.

In this operating condition, the signal YN is such as to drive into the on state both of the transistors 12a and 12b. The memory cells 3, 3' selected are thus electrically connected to the input 6a and to the input 6b, respectively, of the sense amplifier 6, which thus may carry out a double-ended reading in a per se known manner that does not form the subject of the present disclosure.

What is described applies, in a similar way, for reading of any other memory cell 3.

As regards, instead, a single-ended reading of the memory cell 3 addressed by the bitline $BL_L<0>$, the signal $S_{YO}<0>$ assumes a value of 1 V. The remaining signals $S_{YO}<7:1>$ assume a value of 0 V.

Operation of the level shifter 26 is that of raising the signal $S_{YO}<0>$ to the value 3.6 V, thus generating the signal $S_{YO\_HV}<0>$ with high logic value "1".

Since in single-ended reading it is desired to carry out a reading of the memory cell 3 comparing it with the reference current $i_{REF}$, the signal $S_{SE\_L}$ is generated with a high logic value "1", whereas the signal $S_{SE\_R}$ is generated with a low logic value "0", so that only the signal $YO_L<0>$ at output from the logic gate 28 has a high logic value "1", in particular 3.6 V. Instead, the signal $YO_R<0>$ at output from the logic gate 29 has a low logic value "0", in particular 0 V. As described with reference to FIG. 1, the signal $YO_L<0>$ turns on the respective transistor 13a, electrically coupling the memory cell 3 selected to the node A. Instead, the signal $YO_R<0>$ is not able to turn on the respective transistor 13b, thus keeping the memory cells 3' of the local bitline $BL_R<0>$ decoupled from the node B.

In this operating condition, the signal YN is generated with a value such as to drive into the on state both of the transistors 12a and 12b. The memory cell 3 selected is thus electrically connected to the input 6a of the sense amplifier 6.

Furthermore, during single-ended reading, the signal $S_i'$ assumes a value such as to turn on the selection switch 22, electrically coupling the reference-current generator 21 to the second input 6b of the sense amplifier 6.

The sense amplifier 6 may thus carry out a reading of a "single-ended" type in a per se known manner that does not form the subject of the present disclosure.

What has been described applies, in a similar way, to single-ended reading of any other memory cell 3. What has been described likewise applies, in a similar way, to verification by single-ended reading of the memory cells 3', using as current reference the current $i_{REF}$ generated by the current generator 24 and supplied to the input 6a of the sense amplifier 6.

It may be noted that, during single-ended reading of the first memory portion 2a, the selection switches 13b are off, whereas the selection switch 12b is on. It may likewise be noted that, during single-ended reading of the second memory portion 2b, the selection switches 13a are off, whereas the selection switch 12a is on.

In this way, both of the main bitlines $MBL_L$ and $MBL_R$ are capacitively coupled to the respective first and second inputs 6a, 6b of the sense amplifier 6. Since the most important capacitive component, in PCMs, is represented precisely by the main bitline (which is typically provided in the form of metal conductive path typically with a length of 2 mm and a width of 1 μm), a similar, or comparable, capacitive load is in this way guaranteed on both of the inputs 6a, 6b of the sense amplifier 6.

Furthermore, the contributions of the parasitic capacitances due to the transistors 12a, 12b affect the inputs 6a, 6b of the sense amplifier 6 to the same extent, thus reducing the negative effects that different values of capacitance applied to the inputs 6a, 6b may have on the reading operations.

Figure 3:
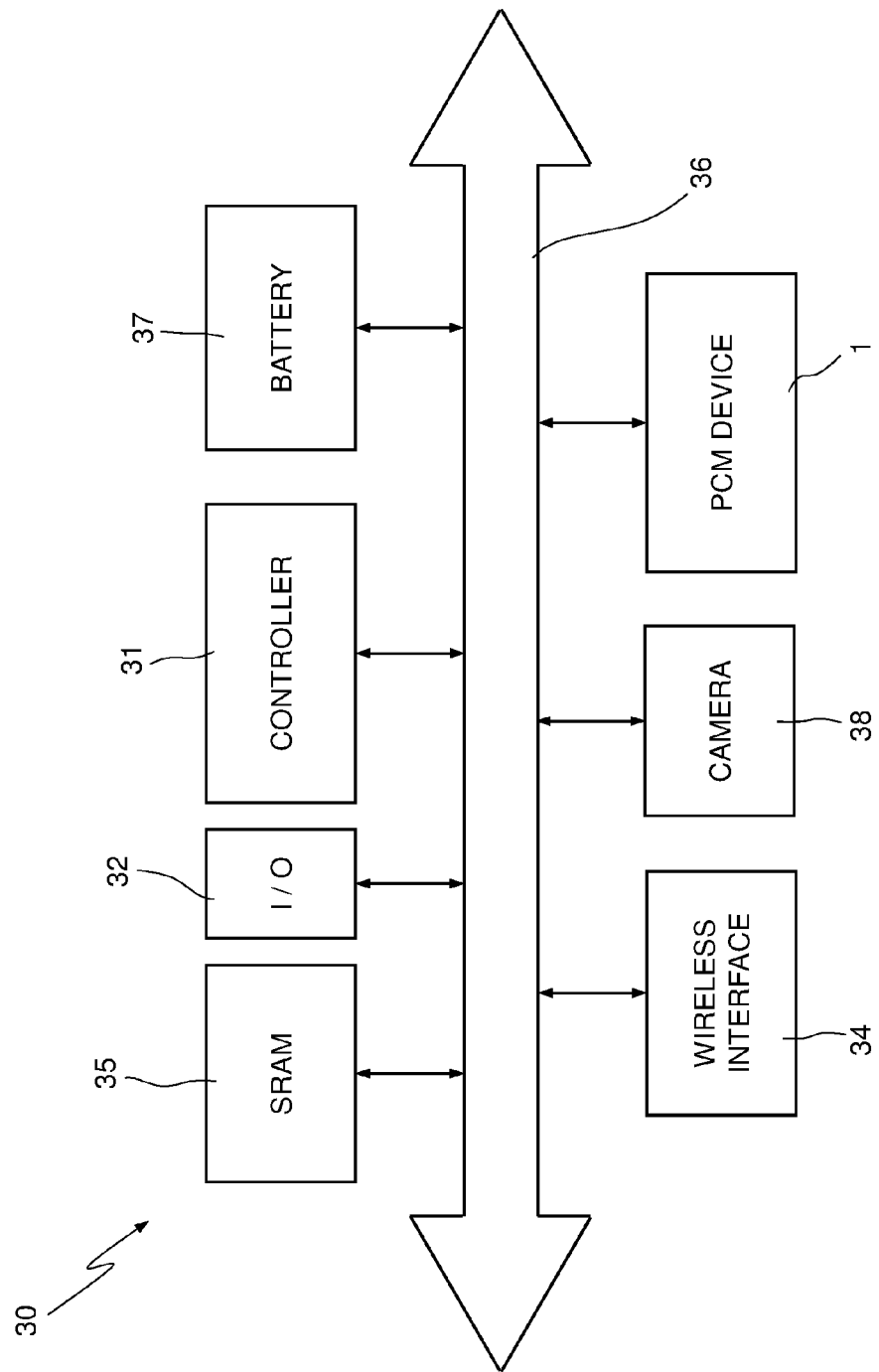
FIG. 3 is a simplified block diagram of an electronic system incorporating the non-volatile memory device, in one embodiment of the present invention.

FIG. 3 illustrates a portion of an electronic system 30, according to a further embodiment of the present invention. The electronic system 30 may be used in electronic devices, such as: a PDA (Personal Digital Assistant); a portable or fixed computer, possibly with wireless data-transfer capacity; a cellphone; a digital audio player; a photographic camera or video camera; or further devices that are able to process, store, transmit and receive information.

In detail, the electronic system 30 comprises a controller 31 (for example, provided with a microprocessor, a DSP, or a microcontroller), an input/output device 32 (for example, provided with a keypad and a display), for entering and displaying data, the non-volatile memory device 1, provided with the array of memory cells of the phase change type described previously, a wireless interface 34, for example, an antenna, for transmitting and receiving data through a radiofrequency wireless communication network and a RAM 35, all coupled through a bus 36. A battery 37 may be used as electric power supply source in the electronic system 30, which may further be provided with a photographic or video camera 38.

From what has been described and illustrated previously, the advantages that the column decoder according to the invention affords are evident.

In any case, it is again emphasized how the separation of the current paths in column decoding enables independent and optimized sizing and design of the corresponding command signals for the selection switches, thus enabling improved performance during reading to be obtained.

The architecture proposed enables reduction of the errors during reading, further improving the times of access to the memory.

Finally, it is clear that modifications and variations may be made to what has been described and illustrated herein, without thereby departing from the scope of the present invention, as defined in the annexed claims.

In particular, the column decoder described and illustrated may be advantageously applied also in other types of memory devices, for example, in flash memory devices.

It is evident that there may be provided a different number of selection switches in the column decoder and a different organization thereof in hierarchical levels. For instance, there may be present a plurality of selection switches 12a, 12b, each coupled to respective eight selection switches 13a according to a tree structure.

Furthermore, with reference to the buffers 19a, 19a' of FIG. 2, the level shifter 26 may be omitted in the case where the signal $S_{YO}<7:0>$ has a logic value compatible with the AND logic gates 28 and 29.

As discussed above, the column decoder of a PCM memory device can be divided into two portions that may be controlled independently of one another and the driving signals of the two portions are configured to guarantee a comparable capacitive load on the two inputs of a sense amplifier in both the single-ended reading operations (used, for example, during verification of data previously written in the memory) and the double-ended reading operations (reading proper of the data during use). In particular embodiments, during single-ended reading, the sense amplifier has a first input coupled both to the capacitance associated to the local bitline of a memory sector selected and to the capacitance associated to the main bitline of the memory sector and a second input, which receives a reference current, is likewise coupled to the capacitance associated to a further main bitline

What is claimed is:

1. A phase change memory device, comprising:
    a memory array that includes a first portion provided with a plurality of first local bitlines connected to first memory cells that store respective logic data, and a second portion provided with a plurality of second local bitlines connected to second memory cells that store respective logic data, the first memory cells and the second memory cells comprising phase change memory cells;
    a reading stage configured to read the logic data stored by the first and second memory cells, the reading stage having a first comparison input and a second comparison input;
    a first main bitline extending between the first comparison input of the reading stage and the first local bitlines, the first main bitline having a first parasitic capacitance;
    a first main switch coupled between the first main bitline and the first comparison input in order to couple and decouple the first main bitline to and from the first comparison input;
    a second main bitline extending between the second comparison input of the reading stage and the second local bitlines, the second main bitline having a second parasitic capacitance;
    a second main switch extending between the second main bitline and the second comparison input in order to couple and decouple the second main bitline to and from the second comparison input;
    a plurality of first local switches, each being associated with a respective one of the first local bitlines in order to couple and decouple each respective first local bitline to and from the first main bitline in order to set up and interrupt a first electrical path between a first selected memory cell and the first main bitline;
    a plurality of second local selection switches, each being associated with a respective one of the second local bitlines in order to couple and decouple each respective second local bitline to and from the second main bitline in order to set up and interrupt a second electrical path between a second selected memory cell and the second main bitline; and
    a first reference signal generator coupled to the second comparison input of the reading stage;
    wherein the phase change memory device is configured to operate in a first reading mode, in which the logic data stored by the first memory cell is read by the reading stage by comparison with the reference signal, wherein in the first reading mode:
        the first main switch and the first local switch, associated to the first local bitline connected to the first selected memory cell are in on-state, thus enabling a first flow of current between the first memory cell selected and the first comparison input of the reading stage;
        all the second local selection switches are in off-state, thus interrupting the second electrical path; and
        the second main switch is in on-state, thus coupling the second main bitline, and consequently the second parasitic capacitance, to the second comparison input of the reading stage.

2. The memory device according to claim 1, wherein the first reading mode is a verification or testing mode of the logic data stored in the first memory cells, the phase change memory device being configured to operate in a second reading mode, in which the logic data stored by the first selected memory cell selected is read by the reading stage by comparison with the logic data stored by the second selected memory cell.

3. The memory device according to claim 2, wherein, in the second reading mode:
    the first main switch and the first local switch that is associated to the first local bitline connected to the first selected memory cell are in on-state, thus enabling the first flow of current; and
    the second main switch and the second local switch that is associated to the second local bitline connected to the second selected memory cell are in on-state, thus enabling a second flow of current between the second selected memory cell and the second comparison input of the reading stage.

4. The memory device according to claim 2, further comprising a second reference signal generator coupled to the first comparison input of the reading stage, the phase change memory device being further configured to operate in a third reading mode, in which the logic data stored by the second selected memory cell is read by the reading stage by comparison with the reference signal on the first comparison input, wherein the third reading mode is a verification or testing mode of the logic data stored in the second memory cells and wherein during the third reading mode:
    the second main switch and the second local switch that is associated to the second local bitline connected to the second selected memory cell are in on-state, thus enabling a second flow of current between the second memory cell selected and the second comparison input of the reading stage;
    all the first local switches are in off-state, thus interrupting the first electrical path; and
    the first main switch is in on-state, thus coupling the first main bitline and thus the first parasitic capacitance, to the first comparison input of the reading stage.

5. The memory device according to claim 1, further comprising a plurality of drivers, each having an output coupled to a control terminal of a respective one of the first and second local switches;
    wherein each driver is configured to receive a control signal at an input at and provide a first command signal and a second command signal at the output; and
    wherein a selected driver is configured to supply the first command signal to the control terminal of the first local switch associated with the bitline connected to the first selected memory cell and to supply the second command signal to the control terminal of the second local switch associated with the bitline connected to the second selected memory cell.

6. The memory device according to claim 5, wherein, during the first reading mode, the first command signal has a value such as to turn on the first local switch associated with the bitline connected to the first selected memory cell and the second command signal has a value such as to turn off the second local switch associated with the bitline connected to the second selected memory cell.

7. The memory device according to claim 5, wherein the phase change memory device is configured to operate in a second reading mode, in which the logic data stored by the first selected memory cell selected is read by the reading stage by comparison with the logic data stored by the second selected memory cell, wherein each driver comprises:
 a first AND logic gate configured to receive a logic signal correlated to the control signal and a first operating-mode selection signal and to generate the first command signal; and
 a second AND logic gate configured to receive the logic signal correlated to the control signal and a second operating-mode selection signal and to generate the second command signal;
 wherein, when the logic signal correlated to the control signal has a high logic value and both the first and second operating-mode selection signals have a high logic value, the first command signal has a value such as to turn on the respective first local switch to let the memory device operate in the second reading mode; and
 when the logic signal correlated to the control signal has a high logic value, the first operating-mode selection signal has a high logic value and the second operating-mode selection signal has a low logic value, the second command signal has a value such as to turn off the respective second local switch to let the memory device operate in the first reading mode.

8. The memory device according to claim 7, wherein each driver further comprises a level shifter configured to receive the control signal and a supply signal and to generate the logic signal correlated to the control signal.

9. The memory device according to claim 1, wherein each of the first and second memory cells comprises a phase change region that can be electrically connected to one of the first and second bitlines, and a selection transistor, operatively coupled to the phase change region and having a control terminal connected to a respective wordline of the array.

10. The memory device according to claim 1, wherein the first and second main switches and the first and second local switches are NMOS transistors.

11. An electronic system comprising a phase change memory device according to claim 1, wherein the electronic system comprises a PDA (Personal Digital Assistant), a portable computer, a cellphone, a digital audio player, a photographic camera or video camera.

12. A method for decoding, during a reading operation, a memory array that includes a first portion provided with a plurality of first local bitlines connected to first memory cells that store respective logic data, a second portion provided with a plurality of second local bitlines connected to second memory cells that store respective logic data, a first main bitline extending between a first comparison input of a reading stage and the first local bitlines, and a second main bitline extending between a second comparison input of the reading stage and the second local bitlines, the method comprising:
 selecting a first memory cell coupled to a selected first local bitline; and
 in a first operating condition, reading the logic datum stored in the selected first memory cell by:
  coupling the first main bitline to the first comparison input;
  coupling the first selected local bitline to the first main bit line, thus enabling a first flow of current between the selected first memory cell and the first comparison input of the reading stage;
  decoupling the second local bitlines from the second main bitline;
  supplying a reference signal to the second comparison input of the reading stage; and
  coupling the second main bitline to the second comparison input of the reading stage, thus coupling a parasitic capacitance from the second main bitline to the second comparison input.

13. The method according to claim 12, further comprising:
 selecting a second memory cell coupled to a selected second local bitline; and
 in a third operating condition that is different than the first operating condition, reading the logic datum stored in the selected second memory cell by:
  coupling the second main bitline to the second comparison input;
  coupling the selected second local to the second main bitline, thus enabling a flow of current between the selected second memory cell and the second comparison input of the reading stage;
  decoupling the first local bitlines from the first main bitline;
  supplying the reference signal to the first comparison input of the reading stage; and
  coupling the first main bitline to the first comparison input of the reading stage, thus coupling a parasitic capacitance of the first main bitline to the first comparison input.

14. The method according to claim 12, further comprising:
 selecting a second memory cell coupled to a selected second local bitline; and
 reading, in a second operating condition that is different than first operating condition, the logic data stored in the selected first memory cell by comparing the logic data stored in the selected first memory cell with the logic data stored in the selected second memory cell, the reading in the second operating condition comprising:
  coupling the first main bitline to the first comparison input;
  coupling the selected first local bitline to the first main bitline;
  coupling the second main bitline to the second comparison input; and
  coupling the selected second local bitline to the second main bitline, thus enabling a flow of current between the second memory cell selected and the second comparison input of the reading stage.

15. The method according to claim 14, further comprising:
 generating a first command signal and a second command signal based on a control signal;

using the first command signal to couple the selected first local bitline to the first main bitline in a first operating condition; and using the second command signal to decouple the selected second local bitline from the second main bitline in the second operating condition.

16. The method according to claim 15, wherein generating the first and second command signals includes, in the first operating condition:

supplying, on respective inputs of a first AND logic gate, a logic signal correlated to the control signal and a first operating-mode selection signal, both the logic signal correlated to the control signal and the first operating-mode selection signal having a high logic value; and supplying, on respective inputs of a second AND logic gate, the logic signal correlated to the control signal and a second operating-mode selection signal, where the second operating-mode selection signal has a low logic value.

17. The method according to claim 16, further comprising:

selecting a second memory cell coupled to a selected second local bitline; and reading, in a second operating condition that is different than first operating condition, the logic data stored in the selected first memory cell by comparing the logic data stored in the selected first memory cell with the logic data stored in the selected second memory cell, the reading in the second operating condition comprising:

coupling the first main bitline to the first comparison input;

coupling the selected first local bitline to the first main bitline;

coupling the second main bitline to the second comparison input;

coupling the selected second local bitline to the second main bitline, thus enabling a flow of current between the second memory cell selected and the second comparison input of the reading stage; and wherein generating the first and second command signals includes, in the second operating condition:

supplying, on respective inputs of a first AND logic gate, the logic signal correlated to the control signal and a first operating-mode selection signal, both the logic signal correlated to the control signal and the first operating-mode selection signal having a high logic value; and supplying, on respective inputs of a second AND logic gate, the logic signal correlated to the control signal and a second operating-mode selection signal, wherein the second operating-mode selection signal has a high logic value.

18. A phase change memory device, comprising:

a memory array that includes a first portion provided with a plurality of first local bitlines connected to first memory cells and a second portion provided with a plurality of second local bitlines connected to second memory cells, the first memory cells and the second memory cells comprising phase change memory cells;

a reading stage having a first comparison input and a second comparison input;

a first main bitline extending between the first comparison input of the reading stage and the first local bitlines;

a first main switch coupled between the first main bitline and the first comparison input of the reading stage;

a second main bitline extending between the second comparison input of the reading stage and the second local bitlines;

a second main switch extending between the second main bitline and the second comparison input;

a plurality of first local switches, each first local switch being associated with a respective one of the first local bitlines and coupled between the respective first local bitline and the first main bitline;

a plurality of second local selection switches, each second local switch being associated with a respective one of the second local bitlines and coupled between the respective second local bitline and the second main bitline; and a first reference signal generator coupled to the second comparison input of the reading stage;

wherein the phase change memory device is configured to operate in a first reading mode, in which a logic datum stored by a first selected memory cell is read by the reading stage by comparing the logic datum stored by the first selected memory cell with the reference signal; and wherein the phase change memory device is also configured to operate in a second reading mode, in which the logic datum stored by the first selected memory cell is read by the reading stage by comparing the logic datum stored by the first selected memory cell with a logic datum stored by a second selected memory cell.

19. The memory device according to claim 18, wherein the phase change memory device is configured so that in the first reading mode:

the first main switch and a first local switch associated to a first local bitline connected to the first selected memory cell are in on-state;

all the second local selection switches are in off-state; and the second main switch is in on-state; and wherein the phase change memory device is configured so that in the second reading mode:

the first main switch and the first local switch that is associated to the first local bitline connected to the first selected memory cell are in on-state; and the second main switch and a second local switch that is associated to a second local bitline connected to the second selected memory cell are in on-state.

20. The memory device according to claim 18, further comprising a second reference signal generator coupled to the first comparison input of the reading stage, the phase change memory device being further configured to operate in a third reading mode, in which logic data stored by the second selected memory cell is read by the reading stage by comparison of the logic data stored by the second selected memory cell with the reference signal on the first comparison input.

21. The memory device according to claim 18, further comprising a driver with an input coupled to receive a control signal, a first output coupled to a control terminal of a first local switch a first local switch associated to a first local bitline connected to the first selected memory cell, and a second output coupled to a control terminal of a second local switch associated with a second local bitline connected to the second selected memory cell.

22. The memory device according to claim 21, wherein the driver comprises:

a level shifter;

a first AND logic gate with first and second inputs, the first input being coupled to an output of the level shifter; and a second AND logic gate with first and second inputs, the first input being coupled to the output of the level shifter.

23. The memory device according to claim 18, wherein each of the first and second memory cells comprises a phase change region and a selection transistor operatively coupled to the phase change region and having a control terminal connected to a respective wordline of the array.

\* \* \* \* \*